United States Patent
Beery et al.

(10) Patent No.: US 11,929,675 B2
(45) Date of Patent: Mar. 12, 2024

(54) POWER EFFICIENCY AND POWER PERFORMANCE EMBEDDED RECOGNITION

(71) Applicant: Cisco Technology, Inc., San Jose, CA (US)

(72) Inventors: Spencer A. Beery, Blacksburg, VA (US); Caleb Xavier Berger, Bloomington, IN (US); Jerrold Mark Pianin, Peoria, AZ (US); Shuang Liang, Durham, NC (US); Vedant Jain, Boston, MA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 173 days.

(21) Appl. No.: 17/536,585

(22) Filed: Nov. 29, 2021

(65) Prior Publication Data
US 2023/0170797 A1 Jun. 1, 2023

(51) Int. Cl.
*H02M 3/157* (2006.01)
*G01R 31/28* (2006.01)
*G01R 31/40* (2020.01)

(52) U.S. Cl.
CPC ........ *H02M 3/157* (2013.01); *G01R 31/2837* (2013.01); *G01R 31/40* (2013.01)

(58) Field of Classification Search
CPC .... G01R 31/2837; G01R 31/40; H02M 3/157
See application file for complete search history.

(56) References Cited

U.S. PATENT DOCUMENTS

| | | | |
|---|---|---|---|
| 7,394,445 B2* | 7/2008 | Chapuis | G06F 1/30 345/212 |
| 9,285,412 B2* | 3/2016 | Veselic | G01R 31/40 |
| 10,498,217 B1* | 12/2019 | Karin | H02J 3/38 |
| 2010/0164442 A1* | 7/2010 | Vikinski | H02M 3/156 323/234 |
| 2011/0221405 A1* | 9/2011 | Tang | G01R 35/005 323/234 |
| 2011/0298439 A1 | 12/2011 | Ng et al. | |
| 2012/0262141 A1 | 10/2012 | Heineman et al. | |
| 2013/0163287 A1 | 6/2013 | Pal et al. | |
| 2018/0024204 A1 | 1/2018 | Novak | |
| 2018/0335455 A1* | 11/2018 | Xiang | H02H 1/0007 |
| 2019/0004552 A1* | 1/2019 | Hung | G05F 1/565 |

OTHER PUBLICATIONS

Jing Wang, "Digitally Controlled DC-DC Converters with Fast and Smooth Load Transient Response", University of Toronto, Aug. 2013, 163 pages.

* cited by examiner

*Primary Examiner* — Harry R Behm
(74) *Attorney, Agent, or Firm* — Edell, Shapiro & Finnan, LLC

(57) ABSTRACT

Presented herein are techniques in which a software-controlled load is embedded at an output of a point of load (POL) in parallel to a load that receives power from the POL. A small incremental load is applied to the POL using the software-controlled load. A transient response of the POL to the applied small incremental load is measured using an embedded analysis functionality.

20 Claims, 7 Drawing Sheets

POWER EFFICIENCY AND POWER PERFORMANCE EMBEDDED RECOGNITION

TECHNICAL FIELD

The present disclosure relates to measuring the performance of power supplies.

BACKGROUND

The characterization of a power supply during product development can be a tedious process that includes connecting probes and external equipment to a product for testing. As such, a limited number of prototypes are tested and characterized during product development. Additionally, once a product is manufactured, without embedded measurement capabilities, it is impossible to determine how the power supply performs over the lifespan of the product and/or the power supply.

DESCRIPTION OF EXAMPLE EMBODIMENTS

Overview

Components on a printed circuit board (PCB) or in a device require power to operate. Power converters are used to effectively supply different amounts of power to different components on the printed circuit board or in a device. The power converters, referred to as point of load (POL), step down high voltages to appropriate levels to supply to the components. Currently, testing the performance of a POL requires engineers or other users to manually probe the circuit board or components in a device in a lab setting to determine measurements (e.g., voltage, current, etc.) that indicate the performance of the POL.

Implementations described herein include embedding self-contained POL measurement and analysis functionalities/equipment within a device/product containing a POL to perform in situ measurements that may be analyzed to determine the performance of the POL. Embedding the measurement and analysis functionalities within the device/product allows for more efficient testing during product development and over a larger number of prototypes than is currently common. In addition, the embedded measurement and analysis functionalities may be used on an ongoing basis to monitor the device/product once deployed (and in use in the field) with no impact to operations of the device/product.

Implementations described herein involve embedding a software-controlled load bias at an output of the POL to perform real-time measurements of the POL's transient response to a small control load change. The software-controlled load bias is embedded in parallel to a load (e.g., a Network Processing Unit (NPU), Application-Specific Integrated Circuit (ASIC), etc.) receiving power from the POL. Techniques described herein involve applying a small signal/incremental load using the software-controlled load and measuring the transient response of the POL to the applied signal. Measured data is filtered to isolate the response of the small signal from background noise associated with uncontrolled variations of the load current.

As a product that includes the POL carries out its regular operations, a Central Processing Unit (CPU) controls the software-controlled load bias to periodically impose a small incremental load on the POL. Real-time capture of the voltage at the load is processed and filtered to isolate the small signal transient response. Analysis of the transient response may be performed to determine baseline functionality and/or end-of-life indicators associated with the POL.

EXAMPLE EMBODIMENTS

Figure 1:
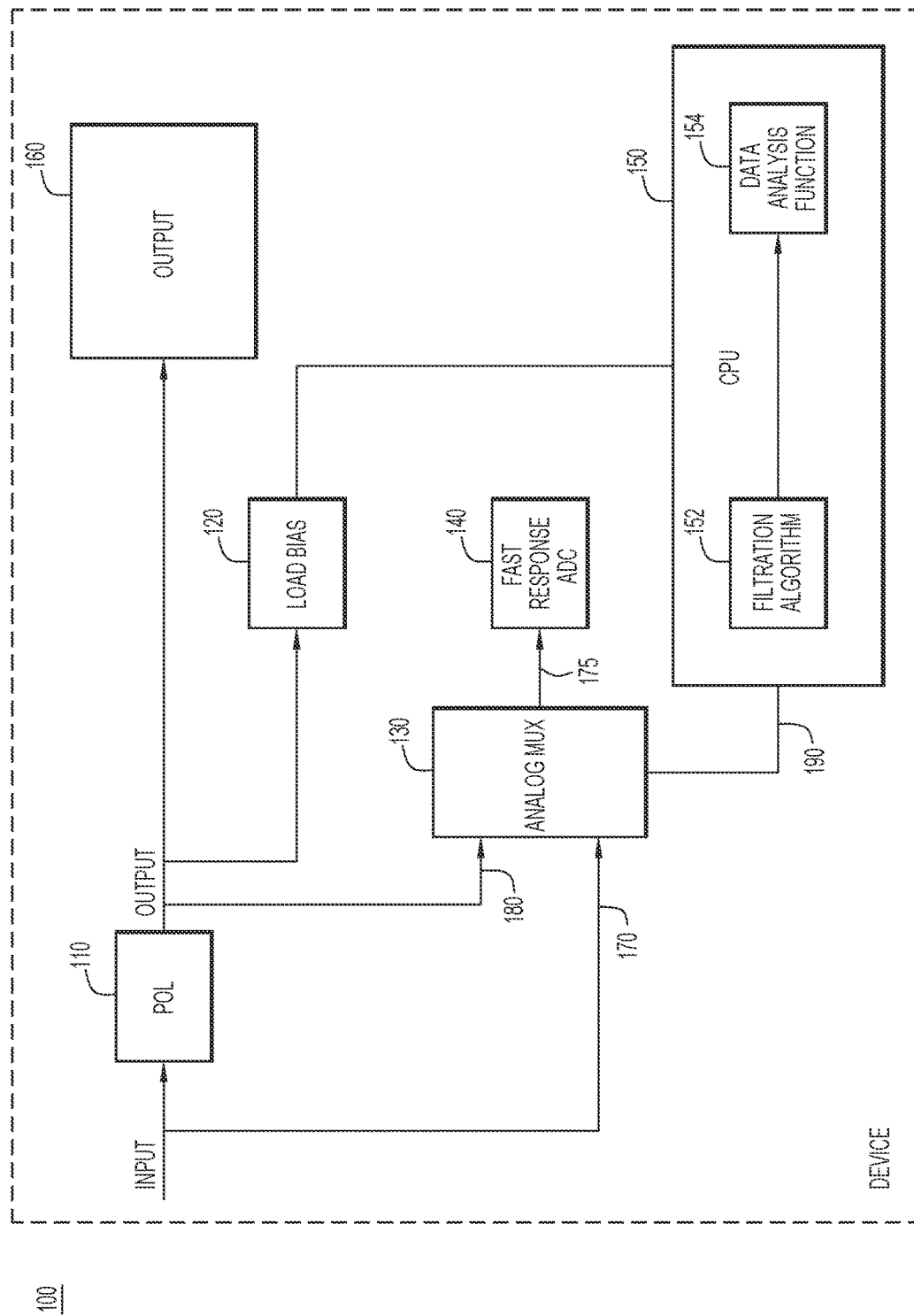
FIG. 1 is a block diagram of a system in which techniques that may facilitate performing measurements that indicate a transient response of a point of load (POL) to a small incremental load applied by a software-controlled load may be implemented, according to an example embodiment.

Referring to FIG. 1, FIG. 1 is a block diagram of a system 100 in which techniques that facilitate performing in situ recording and analysis of a transient response of a POL to a small controllable bias load may be implemented, according to an example embodiment. In at least one embodiment, system 100 may include a POL 110, a load bias 120, an analog multiplexer (MUX) 130, a fast response analog-to-digital converter (ADC) 140, a CPU 150 that includes a filtration algorithm 152 and a data analysis function 154, and a load 160. In one implementation, POL 110, load bias 120, analog MUX 130, fast response ADC 140, and CPU 150 may be included on a printed circuit board.

A POL, such as POL 110, is a power converter used to step down a relatively high power distribution voltage to a lower voltage needed by a system component, such as load 160. Load 160 is a device/processor/circuit/component (e.g., an ASIC, an NPU, etc.) that is receiving power (at some voltage level/current level) from POL 110. There may be multiple POLs 110 in a given system and the techniques presented herein may be used for each POL. For simplicity, only a single POL 110 is shown in FIG. 1.

Techniques described herein involve superimposing a small additional load current on top of the load imposed by load 160 to measure the transient response of POL 110 to the additional small load. The small additional load is provided by load bias 120 at the output of POL 110 and in parallel to load 160. The controlled load is small enough that the controlled load does not interfere with the operation of load 160. Load bias 120 may be an adjustable resistor that may be turned up to apply a small load bias and turned down to turn off the load bias 120.

Load bias 120 may be a software-controlled load bias that is controlled by a central processing unit (CPU) 150. CPU 150 may apply a control signal to load bias 120 to apply a small incremental load to the output of POL 110 periodically or on demand. For example, CPU 150 may apply a control signal to turn up an adjustable resistor periodically or on demand to measure the transient response of POL 110 to the additional small load applied by the adjustable resistor. CPU 150 may additionally turn down the adjustable resistor so POL 110 is not experiencing a load from load bias 120.

The transient response of POL 110 to the small incremental load provided by load bias 120 may be measured by fast response ADC 140. The voltage (V) at the input of POL 110 may be provided to input 170 of analog MUX 130 and the voltage (V) at the output of POL 110 may be provided to the input 180 to analog MUX 130. An analog MUX, such as analog MUX 130, may select between several input signals (in this case, two input signals) and forward the selected input to a single output line. Analog MUX 130 may select between inputs 170 and 180 based on a select input 190 from CPU 150. The output 175 of analog MUX 130 (i.e., the input 170 or the input 180) is provided to fast response ADC 140. To measure the voltage at the input to POL 110, CPU 150 may use select input 190 to control the analog MUX 130 to select input 170 to be forwarded to output 175. To measure the voltage at the output of POL 110, CPU 150 may use select input 190 to control the analog MUX 130 to select input 180 to be forwarded to output 175. Fast response ADC 140 receives output 175 and measures the voltage at the input of POL 110 and the voltage at the output of POL 110. The current may be derived based on the change or difference in voltage between the input and output of POL 110. In one embodiment, the voltage may be measured at the source and destination of the PCB distribution to determine a voltage drop. The approximate resistance of the PCB may be known and the current may be inferred or derived based on the approximate resistance and the voltage drop.

The response at the output of POL 110 (e.g., current, voltage, etc.) may be recorded and processed to filter noise. The response at the output of the POL 110 may be recorded before and after the small load bias is applied by load bias 120. Fast response ADC 140 may output the measurements indicating the transient response of POL 110 to the small step increase to CPU 150 for filtering by the filtration algorithm 152 and analysis by the data analysis function 154, both of which are executed by the CPU 150.

Figure 2:
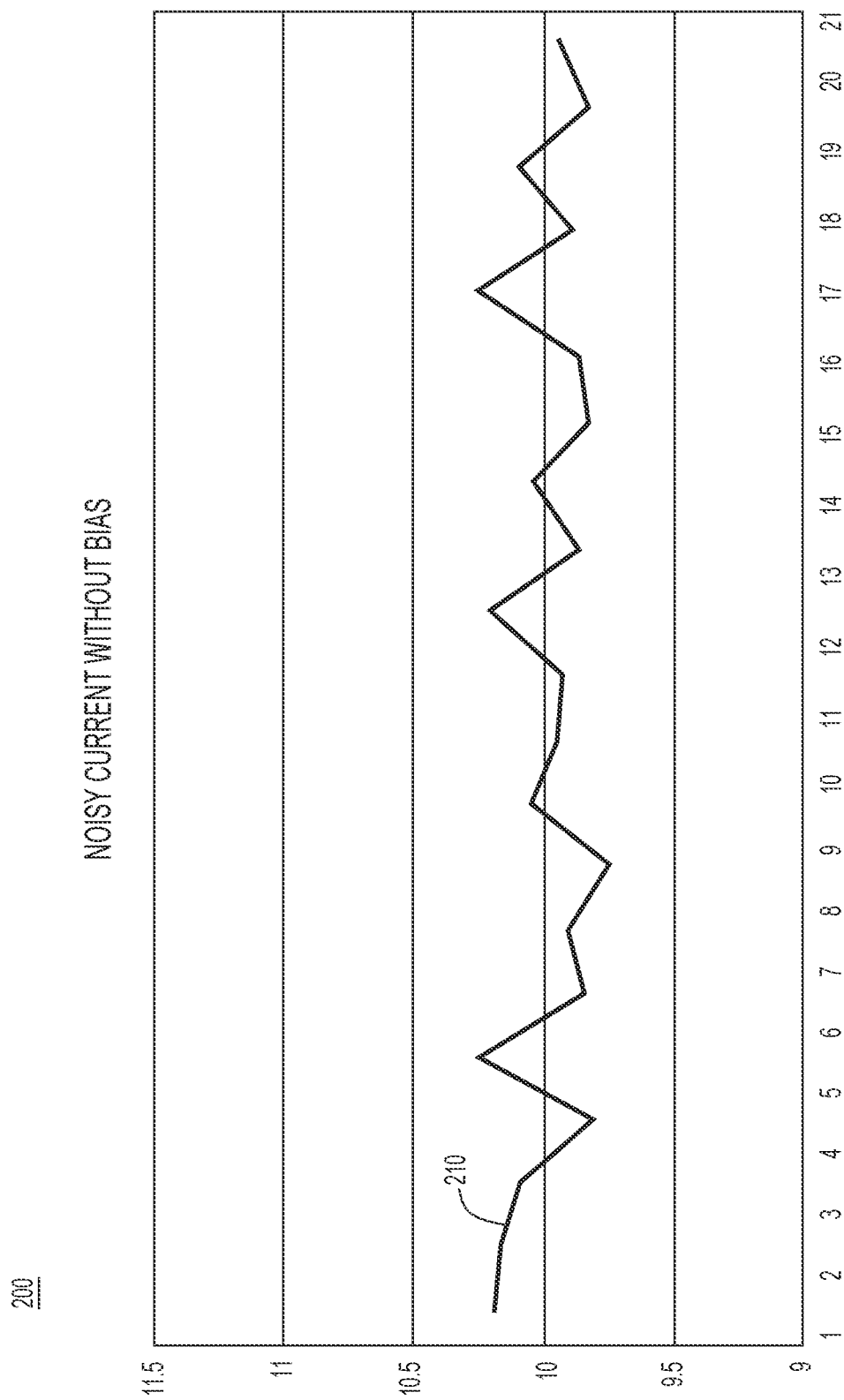
FIG. 2 is a graph illustrating noisy current before the small incremental load is applied to a POL, according to an example embodiment.

Referring to FIG. 2 with continued reference to FIG. 1, FIG. 2 is a graph 200 illustrating a noisy current without a load bias applied. Graph 200 shows time on the x-axis and current on the y-axis. Plot 210 illustrates the noisy current before the load bias is applied. As illustrated by plot 210, the current varies with time. The current may fluctuate due to normal operations of the system in addition to the noise associated with the environment.

Figure 3:
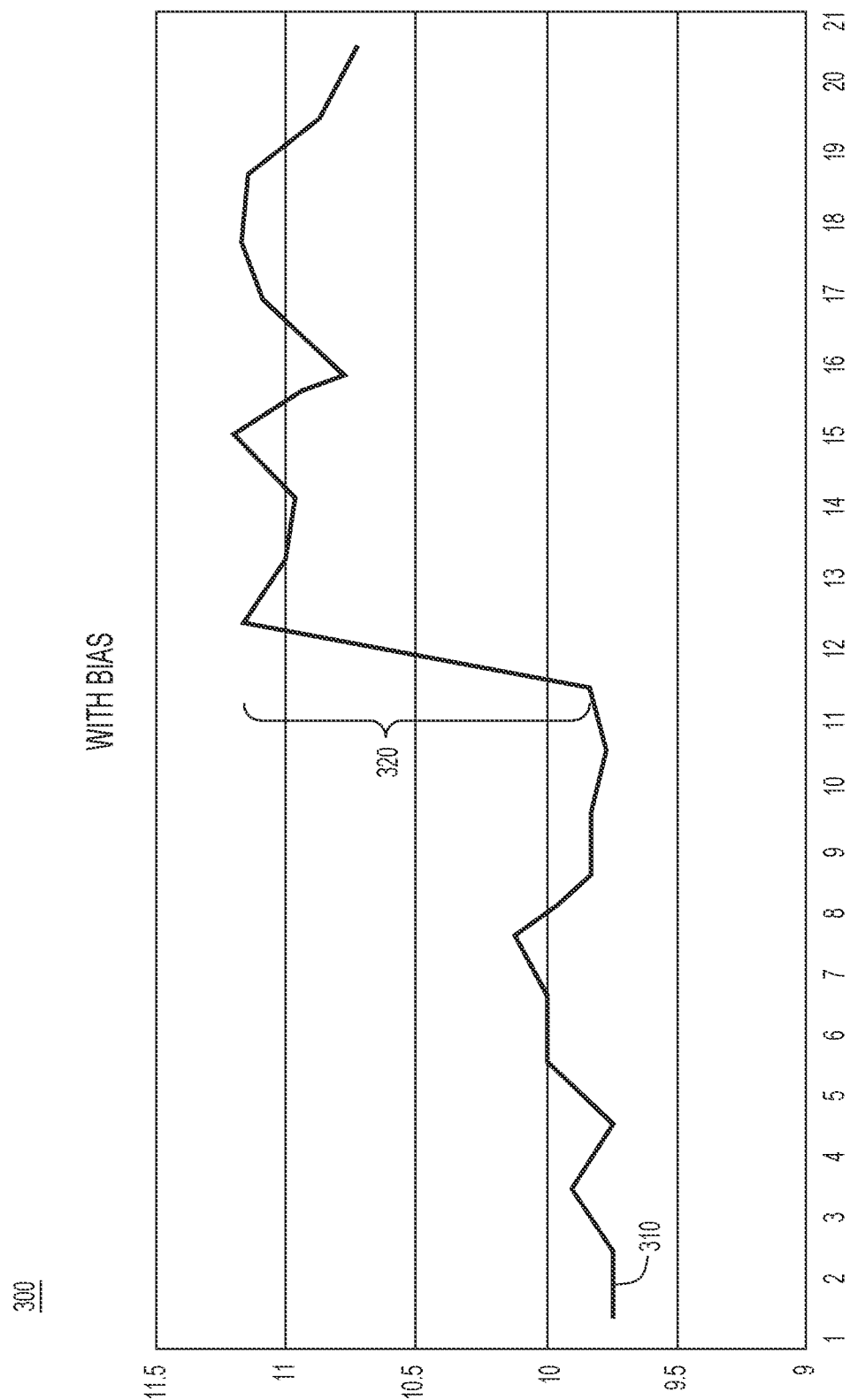
FIG. 3 is a graph illustrating noisy current before and after the small incremental load is applied to a POL, according to an example embodiment.

Referring to FIG. 3 with continued reference to FIG. 1, FIG. 3 is a graph 300 illustrating the noisy current with the small incremental load/step function from load bias 120 applied. Graph 300 shows time on the x-axis and current on the y-axis. Plot 310 illustrates the noisy current before and after the load bias is applied. Portion 320 of plot 310 illustrates the increase in the current when the load bias is applied. Because the system is noisy, filtering may be applied by filtration algorithm 152 (executed by the CPU 150) to extract the desired signal from the noise.

As shown in FIG. 1, filtration algorithm 152 receives the data indicative of the transient response of POL 110 to the applied load bias (e.g., the data depicted in graph 200) and filters the data to extract the desired signal from the noise.

Figure 4:
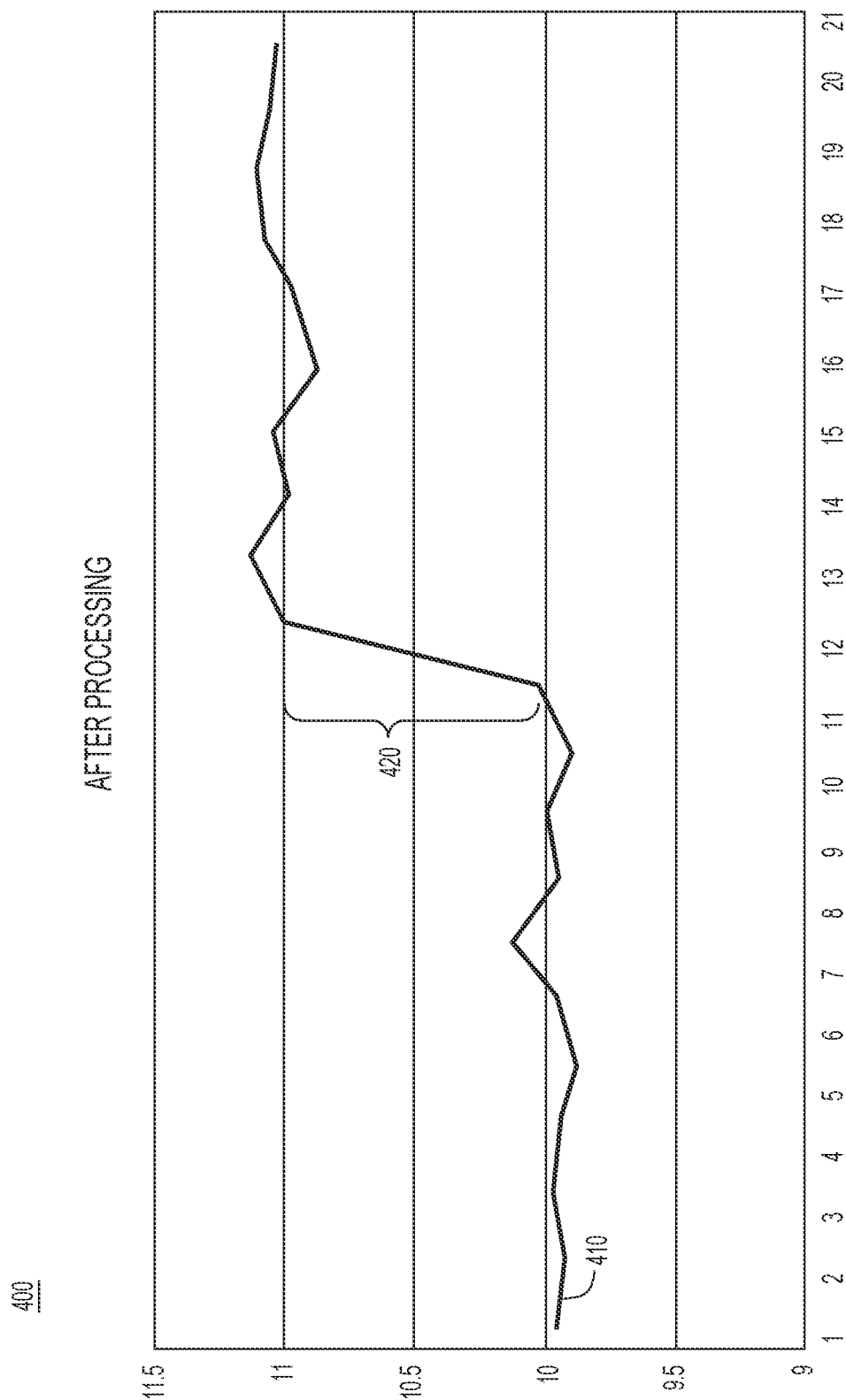
FIG. 4 is a graph illustrating filtered current before and after the small incremental load is applied to a POL, according to an example embodiment.

Referring to FIG. 4, FIG. 4 illustrates a graph 400 (with time on the x-axis and current on the y-axis) illustrating the filtered current with the load bias applied. Plot 410 illustrates the current before and after the load bias is applied and after the noise has been filtered. Portion 420 of plot 410 illustrates the increase in the current when the load bias/step function is applied. The filtering attempts to extract the load bias and the response of POL 110 to the load bias from the background noise associated with uncontrolled variations of the load current. In this way, the transient response of POL 110 may be determined without connecting any external test equipment to the device in which the POL 110 resides.

In the example shown at FIG. 4, an averaging technique may be used to extract the response of the POL 110 to the applied small load bias. In this case, the small load bias may be applied periodically and the transient responses of the POL 110 to the applied small load bias may be averaged to determine the response. For example, the small load bias may be applied ten times at known times and the response of the POL 110 to the applied step functions/small load biases may be averaged to produce plot 410. In this way, outliers or drastic changes in current may be filtered out to extract the true transient response of POL 110 to the small load bias. Other signal processing techniques may additionally or alternatively be applied to extract the response of the POL 110 to the small load bias from the background noise.

Returning to FIG. 1, after the filtering has been performed, data analysis function 154 may perform analysis on the data. The data analysis function 154 may enable local recording and analysis of the transient response of POL 110 to the applied small load. Data indicative of the transient response may be stored locally and/or transmitted to another device or memory (e.g., a user device associated with a user, a cloud storage, etc.) via a wired or wireless connection. The data analysis may provide a baseline for operations of POL 110, be used to monitor ongoing performance of POL 110, provide information that may be used to predict a failure of POL 110, and/or be used in additional ways.

Figure 5:
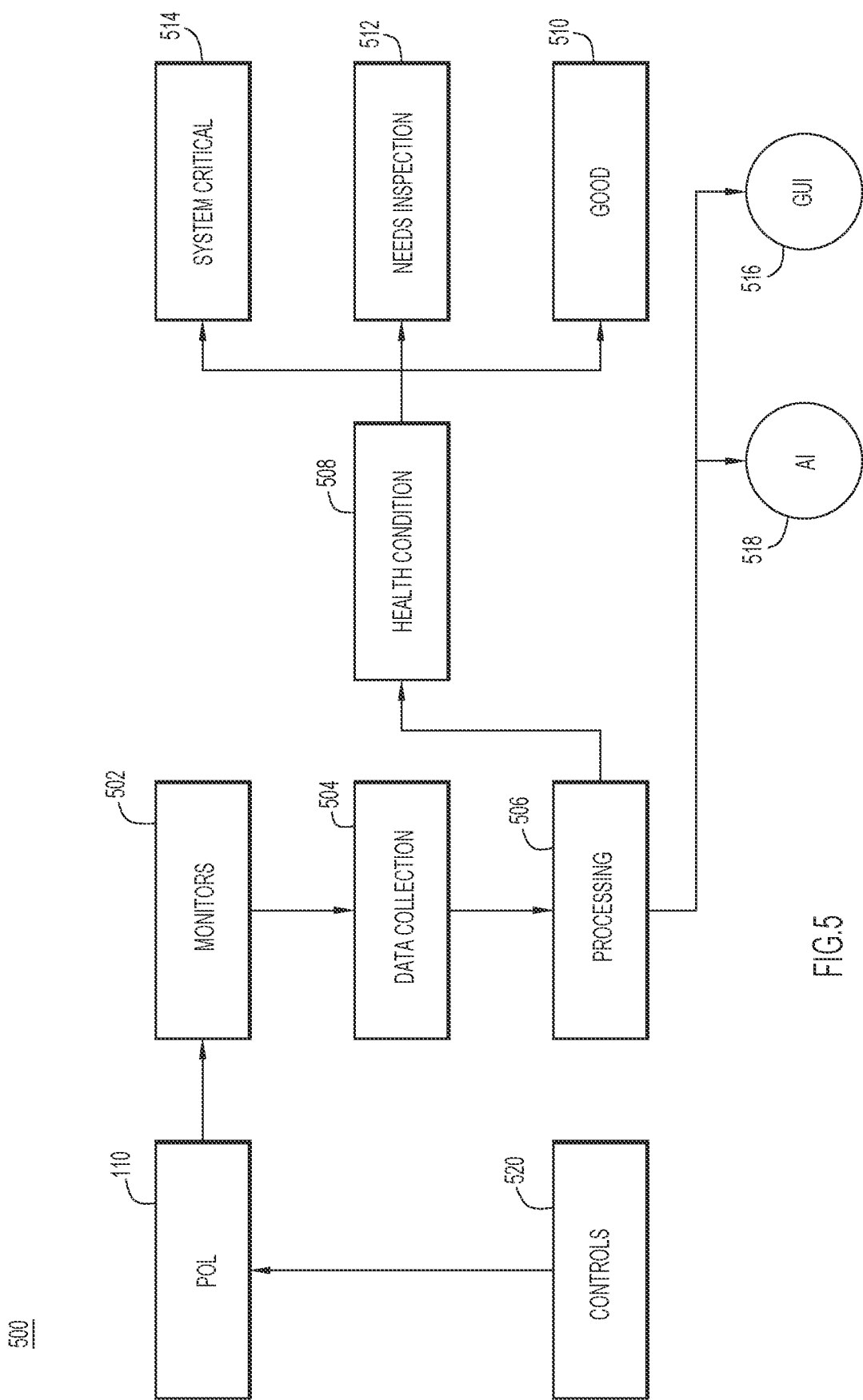
FIG. 5 is a diagram illustrating how the measurements that indicate the transient response of the POL to the small incremental load may be analyzed, according to an example embodiment.

Reference is now made to FIG. 5, with continued reference to FIG. 1. FIG. 5 is a diagram 500 illustrating ways in which the in situ data reflecting the transient response of POL 110 to the small load bias may be used. At 502, the behavior of POL 110 may be monitored based on the small load bias applied. Controls 520 may control operations of POL 110 and the incremental load. Since the measuring and analysis equipment may be embedded at load 160, when a product that includes POL 110 and load 160 is in use, the performance of POL 110 may be continuously monitored based on the voltage and current captured from the input to, and output from, the POL 110. For example, controls 520 (such as CPU 150) may periodically apply the small load bias using load bias 120 and analyze data associated with the response of POL 110 to the applied small load. Thus, at 504 and 506, data associated with the response of the POL 110 to the applied small load may continue to be collected and filtered/processed.

By collecting and processing data indicating the transient response of POL 110 to the small load, a baseline transient response of a healthy POL 110 may be determined. For example, it may be determined that a healthy POL 110 produces a particular transient response when the small load bias is applied. Similarly, indications that the POL 110 needs to be repaired/replaced or is at the end of its life may be determined based on monitoring the POL 110 and collecting and processing the data. For example, based on continuously measuring the response of a POL 110 to the small load bias, it may be determined that the POL 110 reacts to the small load bias in a first manner when POL 110 needs to be repaired or replaced and/or the POL 110 reacts to the small load bias in a second manner when POL 110 is close to failing or is at the end of its life.

Based on continuously monitoring the transient response of POL 110 to the applied small load bias, at 508, the CPU 150 may determine a health condition associated with a POL 110. For example, if the collected data indicates that the POL 110 is producing a transient response in line with a healthy POL 110, at 510, the data analysis may indicate that the POL 110 is good/healthy. If the transient response of the POL 110 has changed and indicates a problem with the POL 110, at 512, the data analysis may indicate that the POL 110 needs inspection and may need to be repaired or replaced. If the transient response of the POL 110 to the small load bias indicates that the POL 110 is close to failure, at 514, the data analysis may indicate that the POL 110 is at a system critical level and should be replaced before it fails.

At 516, results of the processing may be outputted to a graphical user interface (GUI) for additional analysis and user inspection. In one example, the results of the processing may be transmitted to a GUI wirelessly or may be saved to a cloud. In this way, a user of a device/product including the POL 110 and the measuring and analysis functionalities may be able to monitor the health of the POL 110 and/or may be alerted when POL 110 needs to be inspected or when POL 110 is likely to fail.

At 518, artificial intelligence (AI) and/or machine learning may be used to make predictions based on a large dataset derived from measurements taken from a large number of deployed products that include the embedded software-controlled load and measurement functionality. AI and/or machine learning may be used to determine parameters that may indicate failures or performance issues in devices. For example, the transient responses of the POLs in the deployed products to small load biases may be recorded in large datasets and analyzed. Based on the analysis, information may be learned and inferences may be drawn from the patterns in the large datasets. The information and inferences may help predict future product failures or anomalies in POLs.

Figure 6:
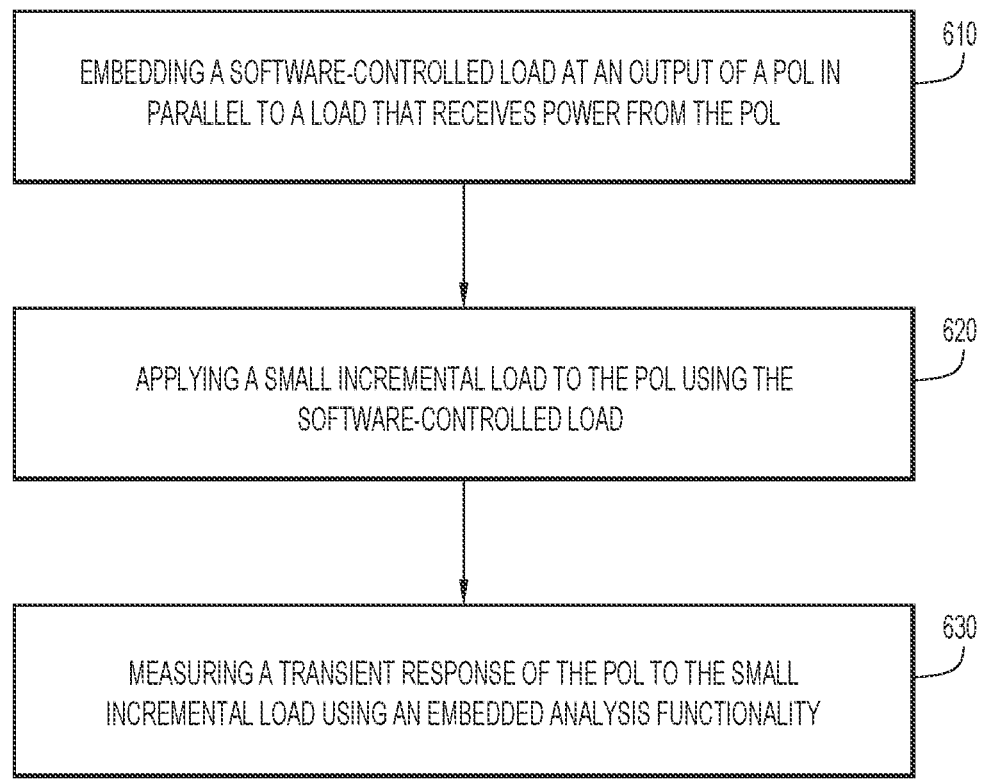
FIG. 6 is a flow chart depicting a method of performing measurements that indicate a transient response of a POL to a small incremental load applied by a software-controlled load, according to an example embodiment.

Referring to FIG. 6, with continued reference to FIG. 1, now described is a flow diagram depicting a method 600 of determining a transient response of a POL 110 to a software-controlled small incremental load bias. The method 600 may be performed by CPU 150 in conjunction with POL 110, load bias 120, analog MUX 130, and fast response ADC 140 of FIG. 1.

At 610, method 600 may include embedding a software-controlled load at an output of a POL in parallel to a load that receives power from the POL. For example, load bias 120 may be embedded (e.g., on a circuit board, in a device/product, etc.) at the output of POL 110 in parallel to load 160.

At 620, method 600 may include applying a small incremental load to the POL using the software-controlled load. For example, CPU 150 may control load bias 120 to apply a small load bias or step increase to POL 110. The small incremental load applied to POL 110 is small enough not to affect operations of the load 160. In addition, the small incremental load may be as small as possible while still being able to observe a response of POL 110 to the small incremental load.

At 630, method 600 may include measuring a transient response of the POL to the applied small incremental load using an embedded analysis functionality. For example, fast response ADC 140 may measure the transient response of POL 110 to the small incremental load by measuring the voltage at POL 110 and at load 160 and deriving the current based on the change or difference in voltage. The transient response of the POL 110 to the applied small load may be filtered and analyzed. In this way, more efficient characterization of prototypes and ongoing monitoring of deployed products that include a POL may be performed without attaching external testing equipment.

Figure 7:
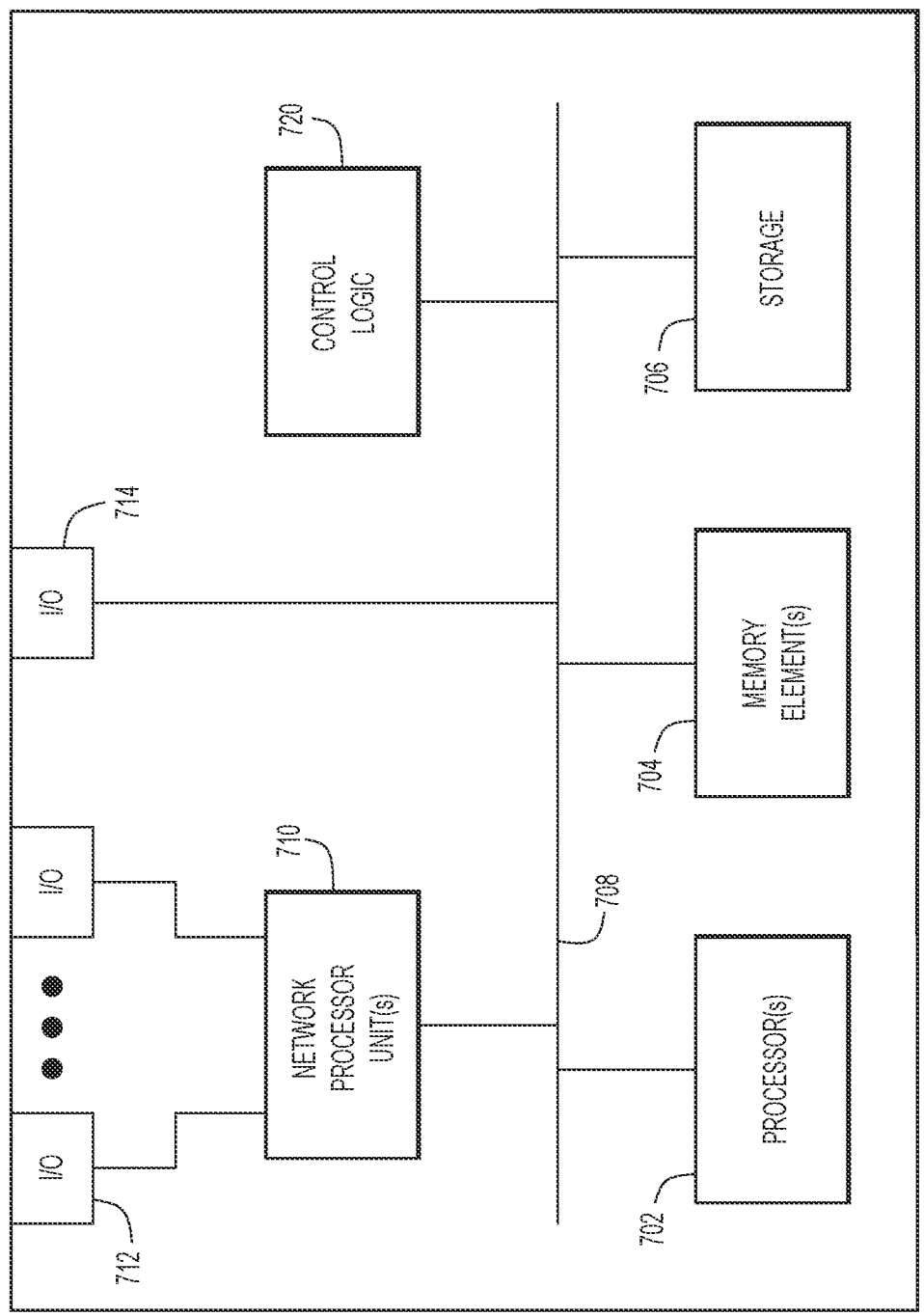
FIG. 7 is a hardware block diagram of a computing device that may perform functions associated with any combination of operations, in connection with the techniques discussed herein.

Referring to FIG. 7, FIG. 7 illustrates a hardware block diagram of a computing device 700 that may utilize the techniques described with regard to FIGS. 1-6. It should be appreciated that FIG. 7 provides only an illustration of one embodiment and does not imply any limitations with regard to the environments in which different embodiments may be implemented. Many modifications to the depicted environment may be made.

In at least one embodiment, computing device 700 may be any apparatus that may include one or more processor(s) 702, one or more memory element(s) 704, storage 706, a bus 708, one or more network processor unit(s) 710 interconnected with one or more network input/output (I/O) interface(s) 712, one or more I/O interface(s) 714, and control logic 720. In various embodiments, instructions associated with logic for computing device 700 can overlap in any manner and are not limited to the specific allocation of instructions and/or operations described herein.

In at least one embodiment, processor(s) 702 is/are at least one hardware processor configured to execute various tasks, operations and/or functions for computing device 700 as described herein according to software and/or instructions configured for computing device. Processor(s) 702 (e.g., hardware processor(s)) can execute any type of instructions associated with data to achieve the operations detailed herein. In one example, processor(s) 702 can transform an element or an article (e.g., data, information) from one state or thing to another state or thing. Any of potential processing elements, microprocessors, digital signal processor, baseband signal processor, modem, PHY, controllers, systems, managers, logic, and/or machines described herein can be construed as being encompassed within the broad term 'processor'.

In at least one embodiment, memory element(s) 704 and/or storage 706 is/are configured to store data, information, software, and/or instructions associated with computing device 700, and/or logic configured for memory element(s) 704 and/or storage 706. For example, any logic described herein (e.g., control logic 720) can, in various embodiments, be stored for computing device 700 using any combination of memory element(s) 704 and/or storage 706. Note that in some embodiments, storage 706 can be consolidated with memory element(s) 704 (or vice versa), or can overlap/exist in any other suitable manner.

In at least one embodiment, bus 708 can be configured as an interface that enables one or more elements of computing device 700 to communicate in order to exchange information and/or data. Bus 708 can be implemented with any architecture designed for passing control, data and/or information between processors, memory elements/storage, peripheral devices, and/or any other hardware and/or software components that may be configured for computing device 700. In at least one embodiment, bus 708 may be implemented as a fast kernel-hosted interconnect, potentially using shared memory between processes (e.g., logic), which can enable efficient communication paths between the processes.

In various embodiments, network processor unit(s) 710 may enable communications (e.g., wired and/or wireless communications) between computing device 700 and other systems, entities, etc., via network I/O interface(s) 712 to facilitate operations discussed for various embodiments described herein. In various embodiments, network processor unit(s) 710 can be configured as a combination of hardware and/or software, such as one or more Ethernet driver(s) and/or controller(s) or interface cards, Fibre Channel (e.g., optical) driver(s) and/or controller(s), wireless receivers/transmitters/transceivers, baseband processor(s)/modem(s), and/or other similar network interface driver(s) and/or controller(s) now known or hereafter developed to enable communications between computing device 700 and other systems, entities, etc. to facilitate operations for various embodiments described herein. In various embodiments, network I/O interface(s) 712 can be configured as one or more Ethernet port(s), Fibre Channel ports, and/or any other I/O port(s) and/or antennas/antenna arrays now known or hereafter developed. Thus, the network processor unit(s) 710 and/or network I/O interface(s) 712 may include any suitable interfaces for receiving, transmitting, and/or otherwise communicating (in a wired and/or wireless manner) data and/or information in a network environment. In one implementation, processor unit(s) 710 may perform the functions of CPU 150 described with respect to FIGS. 1-6.

I/O interface(s) 714 allow for input and output of data and/or information with other entities that may be connected to computing device 700. For example, I/O interface(s) 714 may provide a connection to external devices such as a keyboard, keypad, a touch screen, and/or any other suitable input device now known or hereafter developed. In some instances, external devices can also include portable computer readable (non-transitory) storage media such as database systems, thumb drives, portable optical or magnetic disks, and memory cards. In still some instances, external devices can be a mechanism to display data to a user, such as, for example, a computer monitor, a display screen, or the like.

In various embodiments, control logic 720 can include instructions that, when executed, cause processor(s) 702 to perform operations, which can include, but not be limited to, providing overall control operations of computing device; interacting with other entities, systems, etc. described herein; maintaining and/or interacting with stored data, information, parameters, etc. (e.g., memory element(s), storage, data structures, databases, tables, etc.); combinations thereof; and/or the like to facilitate various operations for embodiments described herein.

The programs described herein (e.g., control logic 720) may be identified based upon application(s) for which they are implemented in a specific embodiment. However, it should be appreciated that any particular program nomenclature herein is used merely for convenience; thus, embodiments herein should not be limited to use(s) solely described in any specific application(s) identified and/or implied by such nomenclature.

In various embodiments, any entity or apparatus as described herein may store data/information in any suitable volatile and/or non-volatile memory item (e.g., magnetic hard disk drive, solid state hard drive, semiconductor storage device, random access memory (RAM), read only memory (ROM), erasable programmable read only memory (EPROM), application specific integrated circuit (ASIC), etc.), software, logic (fixed logic, hardware logic, programmable logic, analog logic, digital logic), hardware, and/or in any other suitable component, device, element, and/or object as may be appropriate. Any of the memory items discussed herein should be construed as being encompassed within the broad term 'memory element'. Data/information being tracked and/or sent to one or more entities as discussed herein could be provided in any database, table, and register, list, cache, storage, and/or storage structure: all of which can be referenced at any suitable timeframe. Any such storage options may also be included within the broad term 'memory element' as used herein.

Note that in certain example implementations, operations as set forth herein may be implemented by logic encoded in one or more tangible media that is capable of storing instructions and/or digital information and may be inclusive of non-transitory tangible media and/or non-transitory computer readable storage media (e.g., embedded logic provided in: an ASIC, digital signal processing (DSP) instructions, software [potentially inclusive of object code and source code], etc.) for execution by one or more processor(s), and/or other similar machine, etc. Generally, memory element(s) 704 and/or storage 706 can store data, software, code, instructions (e.g., processor instructions), logic, parameters, combinations thereof, and/or the like used for operations described herein. This includes memory element(s) 704 and/or storage 706 being able to store data, software, code, instructions (e.g., processor instructions), logic, parameters, combinations thereof, or the like that are executed to carry out operations in accordance with teachings of the present disclosure.

In some instances, software of the present embodiments may be available via a non-transitory computer useable medium (e.g., magnetic or optical mediums, magneto-optic mediums, CD-ROM, DVD, memory devices, etc.) of a stationary or portable program product apparatus, downloadable file(s), file wrapper(s), object(s), package(s), container(s), and/or the like. In some instances, non-transitory computer readable storage media may also be removable. For example, a removable hard drive may be used for memory/storage in some implementations. Other examples may include optical and magnetic disks, thumb drives, and smart cards that can be inserted and/or otherwise connected to a computing device for transfer onto another computer readable storage medium.

In one form, a method is provided that may include embedding a software-controlled load at an output of a point of load (POL) in parallel to a load that receives power from the POL; applying a small incremental load to the POL using the software-controlled load; and measuring a transient response of the POL to the small incremental load using an embedded analysis functionality.

In one example, the method may include filtering the transient response of the POL to the small incremental load to isolate the transient response from background noise associated with the load. In another example, applying the small incremental load to the POL may include applying a control signal to the software-controlled load that is generated by a central processing unit in a device in which the POL is integrated. In another example, applying the small incremental load to the POL may include periodically imposing, by the central processing unit, the small incremental load to the POL via the control signal applied to the software-controlled load.

In another example, the software-controlled load and the embedded analysis functionality are embedded in a device with the POL to enable local recording and analysis of the transient response of the POL. In another example, measuring the transient response may include measuring a first voltage at the load receiving the power from the POL; measuring a second voltage at the POL; determining a voltage difference between the first voltage and the second voltage; and deriving a current based on the voltage difference. In another example, measuring the transient response may include periodically measuring the transient response of the POL to the small incremental load. In another example, the method may include performing an analysis to determine a baseline functionality and/or an end-of life of the POL based on the transient response.

In another form, a device is provided that includes a point of load (POL); a software-controlled load embedded at an output of the POL in parallel to a load that receives power from the POL; and a processing unit configured to perform operations, comprising: applying a small incremental load to the POL using the software-controlled load; and measuring a transient response of the POL to the small incremental load using an embedded analysis functionality.

In still another form, one or more non-transitory computer readable storage media encoded with instructions are provided that, when executed by a processor, cause the processor to execute a method comprising: applying a small incremental load to a point of load (POL) using a software-controlled load that is embedded at the output of the POL in parallel to a load that receives power from the POL; and measuring a transient response of the POL to the small incremental load using an embedded analysis functionality.

Variations and Implementations

Embodiments described herein may include one or more networks, which can represent a series of points and/or network elements of interconnected communication paths for receiving and/or transmitting messages (e.g., packets of information) that propagate through the one or more networks. These network elements offer communicative interfaces that facilitate communications between the network elements. A network can include any number of hardware and/or software elements coupled to (and in communication with) each other through a communication medium. Such networks can include, but are not limited to, any local area network (LAN), virtual LAN (VLAN), wide area network (WAN) (e.g., the Internet), software defined WAN (SD-WAN), wireless local area (WLA) access network, wireless wide area (WWA) access network, metropolitan area network (MAN), Intranet, Extranet, virtual private network (VPN), Low Power Network (LPN), Low Power Wide Area Network (LPWAN), Machine to Machine (M2M) network, Internet of Things (IoT) network, Ethernet network/switching system, any other appropriate architecture and/or system that facilitates communications in a network environment, and/or any suitable combination thereof.

Networks through which communications propagate can use any suitable technologies for communications including wireless communications (e.g., 4G/5G/nG, IEEE 802.11 (e.g., Wi-Fi®/Wi-Fi6®), IEEE 802.16 (e.g., Worldwide Interoperability for Microwave Access (WiMAX)), Radio-Frequency Identification (RFID), Near Field Communication (NFC), Bluetooth™ mm.wave, Ultra-Wideband (UWB), etc.), and/or wired communications (e.g., T1 lines, T3 lines, digital subscriber lines (DSL), Ethernet, Fibre Channel, etc.). Generally, any suitable means of communications may be used such as electric, sound, light, infrared, and/or radio to facilitate communications through one or more networks in accordance with embodiments herein. Communications, interactions, operations, etc. as discussed for various embodiments described herein may be performed among entities that may directly or indirectly connected utilizing any algorithms, communication protocols, interfaces, etc. (proprietary and/or non-proprietary) that allow for the exchange of data and/or information.

In various example implementations, any entity or apparatus for various embodiments described herein can encompass network elements (which can include virtualized network elements, functions, etc.) such as, for example, network appliances, forwarders, routers, servers, switches, gateways, bridges, load balancers, firewalls, processors, modules, radio receivers/transmitters, and/or any other suitable device, component, element, or object operable to exchange information that facilitates or otherwise helps to facilitate various operations in a network environment as described for various embodiments herein. Note that with the examples provided herein, interaction may be described in terms of one, two, three, or four entities. However, this has been done for purposes of clarity, simplicity and example only. The examples provided should not limit the scope or inhibit the broad teachings of systems, networks, etc. described herein as potentially applied to a myriad of other architectures.

Communications in a network environment can be referred to herein as 'messages', 'messaging', 'signaling', 'data', 'content', 'objects', 'requests', 'queries', 'responses', 'replies', etc. which may be inclusive of packets. As referred to herein and in the claims, the term 'packet' may be used in a generic sense to include packets, frames, segments, datagrams, and/or any other generic units that may be used to transmit communications in a network environment. Generally, a packet is a formatted unit of data that can contain control or routing information (e.g., source and destination address, source and destination port, etc.) and data, which is also sometimes referred to as a 'payload', 'data payload', and variations thereof. In some embodiments, control or routing information, management information, or the like can be included in packet fields, such as within header(s) and/or trailer(s) of packets. Internet Protocol (IP) addresses discussed herein and in the claims can include any IP version 4 (IPv4) and/or IP version 6 (IPv6) addresses.

To the extent that embodiments presented herein relate to the storage of data, the embodiments may employ any number of any conventional or other databases, data stores or storage structures (e.g., files, databases, data structures, data or other repositories, etc.) to store information.

Note that in this Specification, references to various features (e.g., elements, structures, nodes, modules, components, engines, logic, steps, operations, functions, characteristics, etc.) included in 'one embodiment', 'example embodiment', 'an embodiment', 'another embodiment', 'certain embodiments', 'some embodiments', 'various embodiments', 'other embodiments', 'alternative embodiment', and the like are intended to mean that any such features are included in one or more embodiments of the present disclosure, but may or may not necessarily be combined in the same embodiments. Note also that a module, engine, client, controller, function, logic or the like as used herein in this Specification, can be inclusive of an executable file comprising instructions that can be understood and processed on a server, computer, processor, machine, compute node, combinations thereof, or the like and may further include library modules loaded during execution, object files, system files, hardware logic, software logic, or any other executable modules.

It is also noted that the operations and steps described with reference to the preceding figures illustrate only some of the possible scenarios that may be executed by one or more entities discussed herein. Some of these operations may be deleted or removed where appropriate, or these steps may be modified or changed considerably without departing from the scope of the presented concepts. In addition, the timing and sequence of these operations may be altered considerably and still achieve the results taught in this disclosure. The preceding operational flows have been offered for purposes of example and discussion. Substantial flexibility is provided by the embodiments in that any suitable arrangements, chronologies, configurations, and timing mechanisms may be provided without departing from the teachings of the discussed concepts.

As used herein, unless expressly stated to the contrary, use of the phrase 'at least one of', 'one or more of', 'and/or', variations thereof, or the like are open-ended expressions that are both conjunctive and disjunctive in operation for any and all possible combination of the associated listed items. For example, each of the expressions 'at least one of X, Y and Z', 'at least one of X, Y or Z', 'one or more of X, Y and Z', 'one or more of X, Y or Z' and 'X, Y and/or Z' can mean any of the following: 1) X, but not Y and not Z; 2) Y, but not X and not Z; 3) Z, but not X and not Y; 4) X and Y, but not Z; 5) X and Z, but not Y; 6) Y and Z, but not X; or 7) X, Y, and Z.

Additionally, unless expressly stated to the contrary, the terms 'first', 'second', 'third', etc., are intended to distinguish the particular nouns they modify (e.g., element, condition, node, module, activity, operation, etc.). Unless expressly stated to the contrary, the use of these terms is not intended to indicate any type of order, rank, importance, temporal sequence, or hierarchy of the modified noun. For example, 'first X' and 'second X' are intended to designate two 'X' elements that are not necessarily limited by any order, rank, importance, temporal sequence, or hierarchy of the two elements. Further as referred to herein, 'at least one of' and 'one or more of' can be represented using the '(s)' nomenclature (e.g., one or more element(s)).

One or more advantages described herein are not meant to suggest that any one of the embodiments described herein necessarily provides all of the described advantages or that all the embodiments of the present disclosure necessarily provide any one of the described advantages. Numerous other changes, substitutions, variations, alterations, and/or modifications may be ascertained to one skilled in the art and it is intended that the present disclosure encompass all such changes, substitutions, variations, alterations, and/or modifications as falling within the scope of the appended claims.

What is claimed is:

1. A method comprising:
embedding a software-controlled load at an output of a point of load (POL) in parallel to a load that receives power from the POL;
applying a small incremental load to the POL using the software-controlled load;
measuring a transient response of the POL to the small incremental load using an embedded analysis functionality; and
determining a health condition associated with the POL based on the transient response.

2. The method of claim 1, further comprising:
filtering the transient response of the POL to the small incremental load to isolate the transient response from background noise associated with the load.

3. The method of claim 1, wherein applying the small incremental load to the POL comprises applying a control signal to the software-controlled load that is generated by a central processing unit in a device in which the POL is integrated.

4. The method of claim 3, wherein applying the small incremental load to the POL includes periodically imposing, by the central processing unit, the small incremental load to the POL via the control signal applied to the software-controlled load.

5. The method of claim 1, wherein the software-controlled load and the embedded analysis functionality are embedded in a device with the POL to enable local recording and analysis of the transient response of the POL.

6. The method of claim 1, wherein measuring the transient response comprises:
measuring a first voltage at the load receiving the power from the POL;
measuring a second voltage at the POL;
determining a voltage difference between the first voltage and the second voltage; and
deriving a current based on the voltage difference.

7. The method of claim 1, wherein measuring the transient response comprises:
periodically measuring the transient response of the POL to the small incremental load.

8. The method of claim 1, wherein determining the health condition comprises:
performing an analysis to determine a baseline functionality and/or an end-of life of the POL based on the transient response.

9. A device comprising:
a point of load (POL);
a software-controlled load embedded at an output of the POL in parallel to a load that receives power from the POL; and
a processing unit configured to perform operations, comprising:
applying a small incremental load to the POL using the software-controlled load;
measuring a transient response of the POL to the small incremental load using an embedded analysis functionality; and
determining a health condition associated with the POL based on the transient response.

10. The device of claim 9, wherein the processing unit is configured to perform further operations comprising:
filtering the transient response of the POL to the small incremental load to isolate the transient response from background noise associated with the load.

11. The device of claim 9, wherein the processing unit performs applying the small incremental load to the POL by applying a control signal to the software-controlled load that is generated by the processing unit.

12. The device of claim 11, wherein the processing unit performs applying the small incremental load to the POL by periodically imposing the small incremental load to the POL via the control signal applied to the software-controlled load.

13. The device of claim 9, wherein the software-controlled load and the embedded analysis functionality are embedded in the device with the POL to enable local recording and analysis of the transient response of the POL.

14. The device of claim 9, wherein the processing unit performs measuring the transient response by:
measuring a first voltage at the load receiving the power from the POL;
measuring a second voltage at the POL;
determining a voltage difference between the first voltage and the second voltage; and
deriving a current based on the voltage difference.

15. The device of claim 9, wherein the processing unit performs measuring the transient response by:
periodically measuring the transient response of the POL to the small incremental load.

16. The device of claim 9, wherein the processing unit performs determining the health condition by:

performing an analysis to determine a baseline functionality and/or an end-of-life of the POL based on the transient response.

17. One or more non-transitory computer readable storage media encoded with instructions that, when executed by a processor, cause the processor to execute a method comprising:
    applying a small incremental load to a point of load (POL) using a software-controlled load that is embedded at an output of the POL in parallel to a load that receives power from the POL;
    measuring a transient response of the POL to the small incremental load using an embedded analysis functionality; and
    determining a health condition associated with the POL based on the transient response.

18. The one or more non-transitory computer readable storage media of claim 17, wherein the method further comprises:
    filtering the transient response of the POL to the small incremental load to isolate the transient response from background noise associated with the load.

19. The one or more non-transitory computer readable storage media of claim 17, wherein applying the small incremental load to the POL includes:
    applying a control signal to the software-controlled load that is generated by the processor.

20. The one or more non-transitory computer readable storage media of claim 19, wherein applying the small incremental load to the POL includes:
    periodically imposing, by the processor, the small incremental load to the POL via the control signal applied to the software-controlled load.

* * * * *